(12) United States Patent
Chien et al.

(10) Patent No.: US 10,936,028 B2
(45) Date of Patent: Mar. 2, 2021

(54) ELECTRONIC DEVICE HAVING A DEFORMATION SENSOR ON A FAN MODULE OF A FAN AND USING A CONTROLLER TO MONITOR THE DEFORMATION SENSOR AND CONTROL OPERATION OF THE FAN BASED ON A DEFORMATION SIGNAL OF THE SENSOR

(71) Applicants: Chih-Chin Chien, Taipei (TW); I-Feng Hsu, Taipei (TW); Ching-Chung Chen, Taipei (TW); Tse-Yang Lin, Taipei (TW); Tse-An Chu, Taipei (TW); Ching-Ya Tu, Taipei (TW); Chang-Yuan Wu, Taipei (TW); Hao-Wu Yang, Taipei (TW); Huan-Yang Yeh, Taipei (TW); Chin-Hsien Chang, Taipei (TW); Chin-Yuan Chuang, Taipei (TW); Chia-Hung Lin, Taipei (TW)

(72) Inventors: Chih-Chin Chien, Taipei (TW); I-Feng Hsu, Taipei (TW); Ching-Chung Chen, Taipei (TW); Tse-Yang Lin, Taipei (TW); Tse-An Chu, Taipei (TW); Ching-Ya Tu, Taipei (TW); Chang-Yuan Wu, Taipei (TW); Hao-Wu Yang, Taipei (TW); Huan-Yang Yeh, Taipei (TW); Chin-Hsien Chang, Taipei (TW); Chin-Yuan Chuang, Taipei (TW); Chia-Hung Lin, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 321 days.

(21) Appl. No.: 15/854,828

(22) Filed: Dec. 27, 2017

(65) Prior Publication Data

US 2018/0228050 A1 Aug. 9, 2018

Related U.S. Application Data

(60) Provisional application No. 62/439,470, filed on Dec. 28, 2016, provisional application No. 62/547,065, filed on Aug. 17, 2017.

(51) Int. Cl.
*G06F 1/20* (2006.01)
*H05K 7/20* (2006.01)
(Continued)

(52) U.S. Cl.
CPC ............. *G06F 1/203* (2013.01); *F04D 25/08* (2013.01); *F04D 27/00* (2013.01); *F04D 27/008* (2013.01);
(Continued)

(58) Field of Classification Search
CPC .... F04D 29/4206; F04D 27/008; F04D 27/00; F04D 25/08; H05K 7/20172;
(Continued)

(56) References Cited

U.S. PATENT DOCUMENTS 4,503,712 A * 3/1985 Vigneaux .................. G01F 1/10
73/861.351
4,656,553 A * 4/1987 Brown ...................... H02P 6/08
361/31
(Continued)

FOREIGN PATENT DOCUMENTS

CN         2375031        4/2000
CN      202500803 U   * 10/2012
(Continued)

OTHER PUBLICATIONS

"Office Action of Taiwan Counterpart Application," dated Apr. 20, 2018, p. 1-p. 4.

*Primary Examiner* — Devon C Kramer
*Assistant Examiner* — Benjamin Doyle
(74) *Attorney, Agent, or Firm* — JCIPRNET

(57) ABSTRACT

An electronic device and a method for controlling a fan operation are provided. A containing space of the electronic device has a fan module and a deformation sensor. The deformation sensor detects whether a fan housing of the fan module is deformed. The deformation sensor transmits a deformation signal to a controller when detecting that the fan housing is deformed. The controller drives a fan blade of the fan module to stop running after receiving the deformation signal.

10 Claims, 7 Drawing Sheets

(51) Int. Cl.
  *H05K 5/00* (2006.01)
  *F04D 27/00* (2006.01)
  *F04D 25/08* (2006.01)

(52) U.S. Cl.
  CPC ............... *G06F 1/20* (2013.01); *G06F 1/206* (2013.01); *H05K 5/0086* (2013.01); *H05K 7/20172* (2013.01); *H05K 7/20209* (2013.01); *H05K 7/20845* (2013.01)

(58) Field of Classification Search
  CPC .... H05K 5/0086; H05K 7/20209; H05K 7/02; G06F 1/206; G06F 1/203; G06F 1/324; G06F 1/20; G06F 1/16; G01M 13/00
  USPC .......................................... 417/18; 310/68 B
  See application file for complete search history.

(56) References Cited

U.S. PATENT DOCUMENTS

| | | | | |
|---|---|---|---|---|
| 7,341,406 | B1* | 3/2008 | Gromley | B65G 51/20 406/197 |
| 9,546,664 | B2* | 1/2017 | Hsu | F04D 25/0613 |
| 2005/0141997 | A1* | 6/2005 | Rast | F04D 25/088 416/229 R |
| 2006/0034713 | A1* | 2/2006 | Lee | F04D 19/042 417/423.1 |
| 2006/0253633 | A1* | 11/2006 | Brundridge | G06F 13/409 710/104 |
| 2007/0039415 | A1* | 2/2007 | Weiss | B23Q 11/04 74/814 |
| 2013/0347099 | A1* | 12/2013 | Smith | G06F 21/316 726/19 |
| 2014/0111935 | A1* | 4/2014 | Ito | G06F 1/20 361/679.48 |
| 2014/0308128 | A1* | 10/2014 | Hsu | F04D 19/002 416/61 |
| 2015/0104311 | A1* | 4/2015 | Brown | F04D 27/007 416/1 |
| 2015/0355693 | A1* | 12/2015 | Chang | G06F 1/203 361/679.48 |
| 2017/0212004 | A1* | 7/2017 | Suzuki | G01M 5/0091 |
| 2018/0074694 | A1* | 3/2018 | Lehmann | G06F 3/044 |

FOREIGN PATENT DOCUMENTS

| | | | | |
|---|---|---|---|---|
| CN | 108073252 | * | 5/2018 | ............... G06F 1/16 |
| JP | 2016024615 A | * | 2/2016 | ............... G06F 1/16 |

* cited by examiner

ELECTRONIC DEVICE HAVING A DEFORMATION SENSOR ON A FAN MODULE OF A FAN AND USING A CONTROLLER TO MONITOR THE DEFORMATION SENSOR AND CONTROL OPERATION OF THE FAN BASED ON A DEFORMATION SIGNAL OF THE SENSOR

CROSS-REFERENCE TO RELATED APPLICATION

This application claims the priority benefits of U.S. provisional application Ser. No. 62/439,470, filed on Dec. 28, 2016 and U.S. provisional application Ser. No. 62/547,065, filed on Aug. 17, 2017. The entirety of each of the above-mentioned patent applications is hereby incorporated by reference herein and made a part of this specification.

BACKGROUND OF THE INVENTION

1. Field of the Invention

The invention relates to an electronic device control mechanism, and more particularly, to an electronic device for temporarily stopping a fan from running and a method for controlling a fan operation.

2. Description of Related Art

In general, a notebook computer is usually provided with a fan module for dissipating heat from the heat-generating components inside the notebook computer. However, because an upper housing on a base has a lower structural strength, if a distance between a heat dissipation fan and the upper housing is smaller while distances from the upper housing to structural members inside the notebook computer are also smaller, the upper housing is prone to deformation caused by pressing of the structural members such that a normal operation of the fan module is also affected by pressing of the upper housing.

Also, most of the fan modules installed inside the electronic device are set to run at full speed. Consequently, given that the normal operation of the fan module is affected by pressing of the upper housing, the fan module may be easily damaged to reduce lifetime of the fan module.

SUMMARY OF THE INVENTION

The invention is directed to an electronic device and a method for controlling a fan operation, which are capable of providing an intelligent fan temporarily stopping function for preventing a fan module from damages caused by external influence during operation.

An electronic device of the invention includes a fan module, a deformation sensor and a controller. The fan module is disposed in a containing space, and includes a fan housing and a fan blade. The fan blade is disposed inside the fan housing. The deformation sensor is disposed in the containing space, and configured to detect whether the fan housing is deformed. The controller is electrically connected to the fan blade and the deformation sensor. The deformation sensor transmits a deformation signal to the controller when detecting that the fan housing is deformed, and the controller drives the fan blade to stop running after receiving the deformation signal.

In an embodiment of the invention, the fan blade includes a metal fan blade. The fan module further includes an electromagnet. The electromagnet generates an electromagnetic attraction force after being powered up. The controller provides an electric power to the electromagnet after receiving the deformation signal so the metal fan blade stops running due to the electromagnetic attraction force.

In an embodiment of the invention, the electronic device further includes a fan speed sensor. The fan speed sensor is coupled to the controller, and configured to detect a fan speed of the metal fan blade. When the controller drives the fan blade to stop running, if it is detected that the fan speed is not equal to 0, the controller increases the electric power provided to the electromagnet to increase the electromagnetic attraction force until the fan speed is equal to 0.

In an embodiment of the invention, the fan module further includes a drive-motor. The drive-motor is coupled to the fan blade and configured to drive the fan blade to start running. The controller disables the drive-motor after receiving the deformation signal so the fan blade stops running.

In an embodiment of the invention, the controller determines whether a system power consumption of the electronic device is greater than a predetermined power consumption after the fan blade stops running, and when the system power consumption is greater than the predetermined power consumption, the controller performs a frequency dividing action on a processor until the system power consumption is less than or equal to the predetermined power consumption.

In an embodiment of the invention, whether the fan housing is deformed is continuously detected by the deformation sensor after the system power consumption is less than or equal to the predetermined power consumption, and the fan blade continuously stops running when continuously detecting that the fan housing is deformed. The controller restores a power of the processor and drives the fan blade to start running when the deformation sensor detects that the fan housing is released from being deformed.

In an embodiment of the invention, the deformation sensor is one of a strain gauge, a distance sensor, a click sensor or a Hall sensor.

An electronic device of the invention includes: a fan module, disposed in a containing space, and including a fan housing and a fan blade, wherein the fan blade is disposed inside the fan housing; a first metal sheet, disposed on a surface of the fan housing; a second metal sheet, disposed inside a housing of the electronic device; and a controller, electrically connected to the fan module, the first metal sheet and the second metal sheet. The controller detects a short-circuit condition and drives the fan blade to stop running when the housing of the electronic device is pressed by an external force to deform the fan housing such that the first metal sheet and the second metal sheet are in contact with each other to cause short circuit.

A method for controlling a fan operation of the invention includes the following steps. Whether a fan housing of a fan module is deformed is detected by a deformation sensor, wherein the fan module and the deformation sensor are disposed in a containing space of an electronic device. A deformation signal is transmitted to a controller by the deformation sensor when detecting that the fan housing is deformed. A fan blade of the fan module is driven to stop running after receiving the deformation signal by the controller.

A method for controlling a fan operation of the invention includes: determining whether a fan housing of a fan module is deformed by a first metal sheet and a second metal sheet, wherein the fan module is disposed in a containing space of an electronic device, the fan blade is disposed inside the fan housing, and the first metal sheet and the second metal sheet are disposed on a surface of the fan housing and inside a housing of the electronic device respectively; detecting a short-circuit condition and driving the fan blade to stop running by the controller when the housing of the electronic device is pressed by an external force to deform the fan housing such that the first metal sheet and the second metal sheet are in contact each other to cause short circuit, wherein the controller is electrically connected to the fan module, the first metal sheet and the second metal sheet.

Based on the above, the invention provides the intelligent fan temporarily stopping function which can drive the fan blade to stop running when the fan housing is deformed. As a result, the fan module may be prevented from damages due to external influence when the fan module operates at full speed so an operating life of the fan module can be increased.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
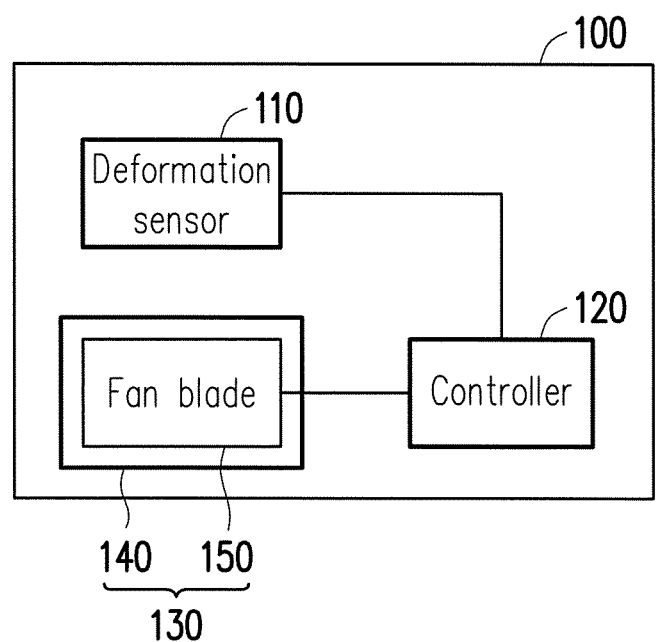
FIG. 1 is a block diagram of an electronic device according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1 is a block diagram of an electronic device according to an embodiment of the invention. With reference to FIG. 1, an electronic device 100 includes a deformation sensor 110, a controller 120 and a fan module 130. The fan module 130 includes a fan housing 140 and a fan blade 150. The fan blade 150 is disposed inside the fan housing 140. The electronic device 100 has a containing space, and the fan module 130 and the deformation sensor 110 are disposed in the containing space.

The deformation sensor 110 is, for example, a strain gauge, a distance sensor, a click sensor or a Hall sensor. The deformation sensor 110 is configured to detect whether the fan housing 140 is deformed. The deformation sensor 110 may be disposed on a surface of the fan housing 140. Alternatively, the deformation sensor 110 may also be disposed in a vicinity of the fan housing 140 (e.g., disposed on a lower housing or an upper housing of the electronic device 100.

In addition, the deformation sensor 110 may also be implemented by two metal sheets so whether the fan housing 140 of the fan module 130 is deformed by a housing of the electronic device 100 pressed by an external force can be determined through the two metal sheets. Said two metal sheets are disposed on the surface of the fan housing 140 and inside the housing of the electronic device 100 respectively. When the housing of the electronic device 100 is pressed by the external force such that the two metal sheets are in contact with each other to cause short circuit, the controller 120 detects such short-circuit condition and drives the fan blade 150 to stop running.

The controller 120 may be implemented by using an embedded controller or a fan control ship originally provided in the electronic device 110, or may be implemented by additionally disposing another control chip. The controller 120 is electrically connected to the fan module 130 and the deformation sensor 110, and configured to receive data transmitted by the deformation sensor 110 thereby determining whether to drive the fan blade 150 to stop running or resume running. For example, when the deformation signal is received, the fan blade 150 is driven to stop running.

FIG. 2A to FIG. 2D are schematic diagrams illustrating implementations of a deformation sensor according to an embodiment of the invention. In the present embodiment, the electronic device 100 is a notebook computer, in which a containing space S formed between an upper housing 210 and a lower housing 220 on a base, and the fan module 130 is disposed in the containing space S for dissipating heat. The deformation sensor 110 may be, for example, embedded in at least one of the upper housing 210 and the lower housing 220, or may also be externally disposed on a surface of at least one of the upper housing 210 and the lower housing 220 facing the containing space S. Said at least one of the upper housing 210 and the lower housing 220 on which the deformation sensor 110 is disposed may be determined depending on the actual circumstance. In this way, if the fan housing 140 is pressed by the upper housing 210 or the lower housing 220 of the electronic device 100 due to external influence, whether the fan housing 140 is deformed may be determined by the deformation sensor 110. In addition, the deformation sensor 110 may also be directly disposed on an upper surface or a lower surface of the fan housing 140.

Figure 2A:
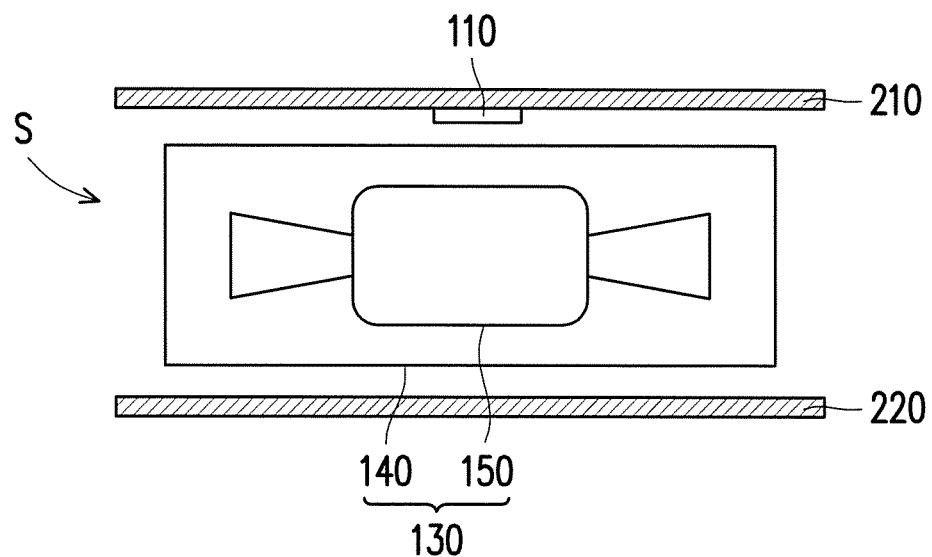
FIG. 2A to FIG. 2D are schematic diagrams illustrating implementations of a deformation sensor according to an embodiment of the invention.
Figure 2B:
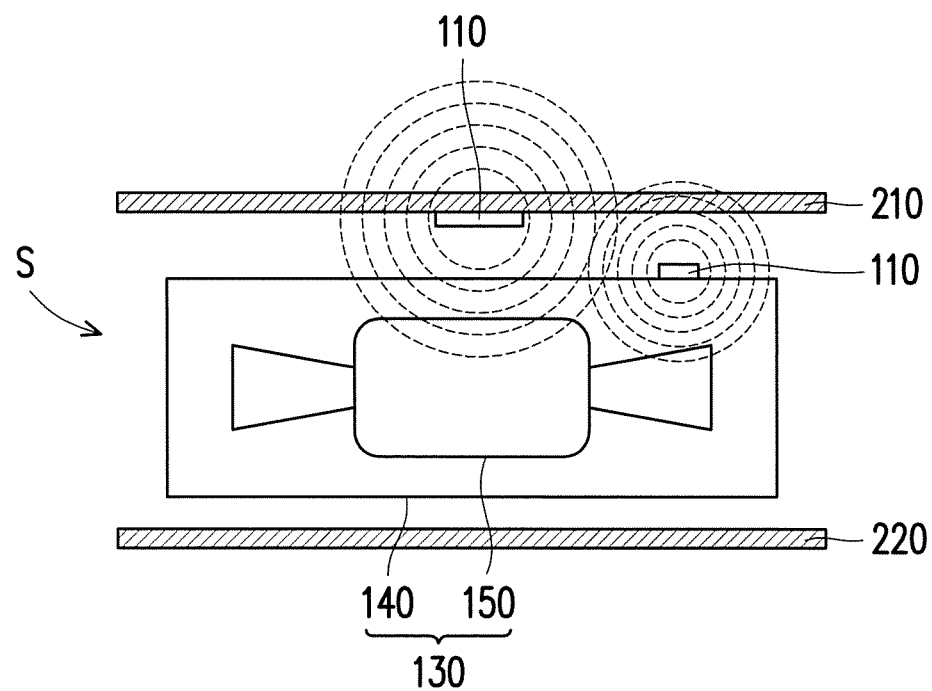
Figure 2C:
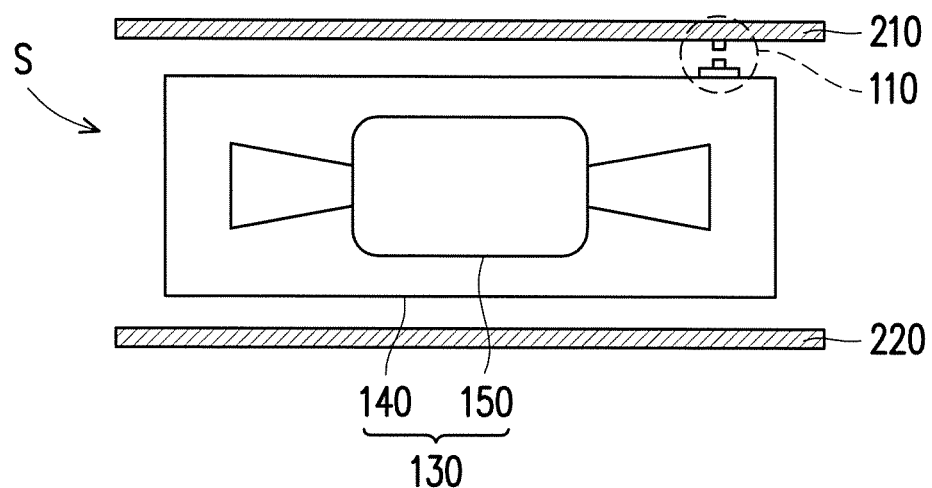
Figure 2D:
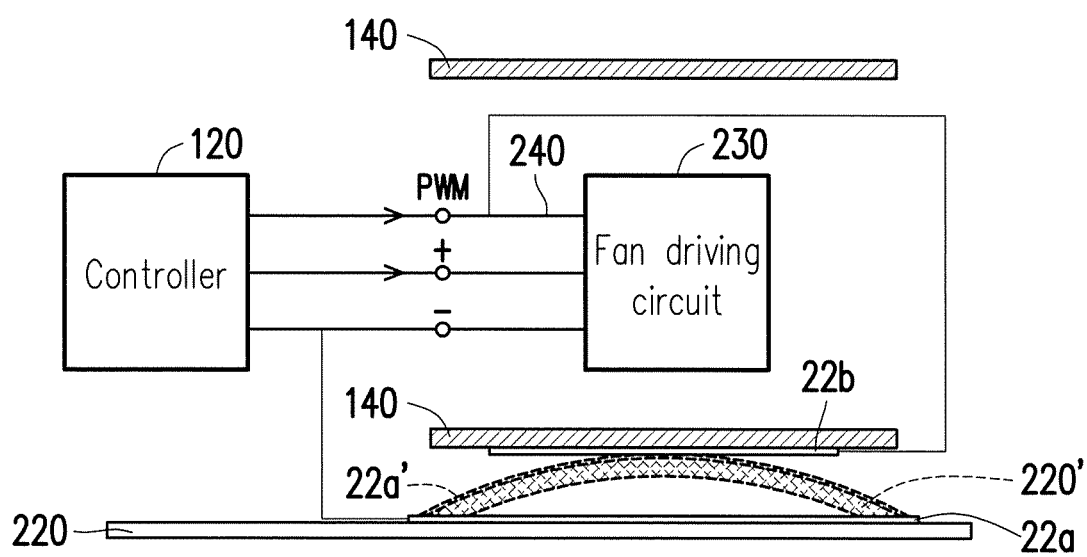

In FIG. 2A, the deformation sensor 110 is, for example, the strain gauge or the distance sensor. The distance sensor is, for example, an infrared sensor. In FIG. 2B, the deformation sensor 110 is the Hall sensor, which determines whether the fan housing 140 is deformed by utilizing a magnetic cutting line. In FIG. 2C, the deformation sensor 110 is the click sensor. In FIG. 2D, the deformation sensor 110 is implemented by two metal sheets.

Illustration of FIG. 2D shows that a first metal sheet 22b is disposed on a surface of the fan housing 140 and a second metal sheet 22a is disposed inside the lower housing 220 of the electronic device 100, wherein the fan module 130 further includes a fan driving circuit 230, and the fan driving circuit 230 is disposed inside the fan housing 140 and coupled to the fan blade 150 to drive the fan blade 150 to start running. The fan driving circuit 230 is connected to the first metal sheet 22b by a pulse width modulation (PWM) signal via a wire 240, whereas the second metal sheet 22a inside the lower housing 220 is connected to a ground signal. When the lower housing 220 of the electronic device 100 is affected by the external force, the lower housing 220 and the second metal sheet 22a are deformed (the deformed lower housing 220' and the deformed second metal sheet 22a'), and the deformed second metal sheet 22a' is in contact with the first metal sheet 22b to cause the short circuit. In this case, the controller 120 can detect the short-circuit condition and drive the fan blade to stop running.

More specifically, when the housing of the electronic device 100 is not deformed, the PWM signal is controlled by the controller 120. When the lower housing 220 of the electronic device 100 is deformed by the external force, the lower housing 220' of the electronic device 100 touches the fan housing 140. In this case, the PWM signal is connected to the ground signal via the first metal sheet 22b on the surface of the fan housing 140 in contact with the second metal sheet 22a' of the lower housing 220' to cause short circuit, and after detecting a short-circuit condition, the controller 120 generates and transmits the deformation signal to the fan driving circuit 230 so the fan blade 150 immediately stops running.

Further, two metal sheets may also be disposed on an inner side of the upper housing 210 of the electronic device 100 and the surface of the fan housing 140 respectively. Alternatively, two metal sheets may be disposed on the inner side of the upper housing 210 and the surface of the fan housing 140 respectively while there are two metal sheets disposed on the inner side of the lower housing 220 and the surface of the fan housing 140 respectively.

Figure 3:
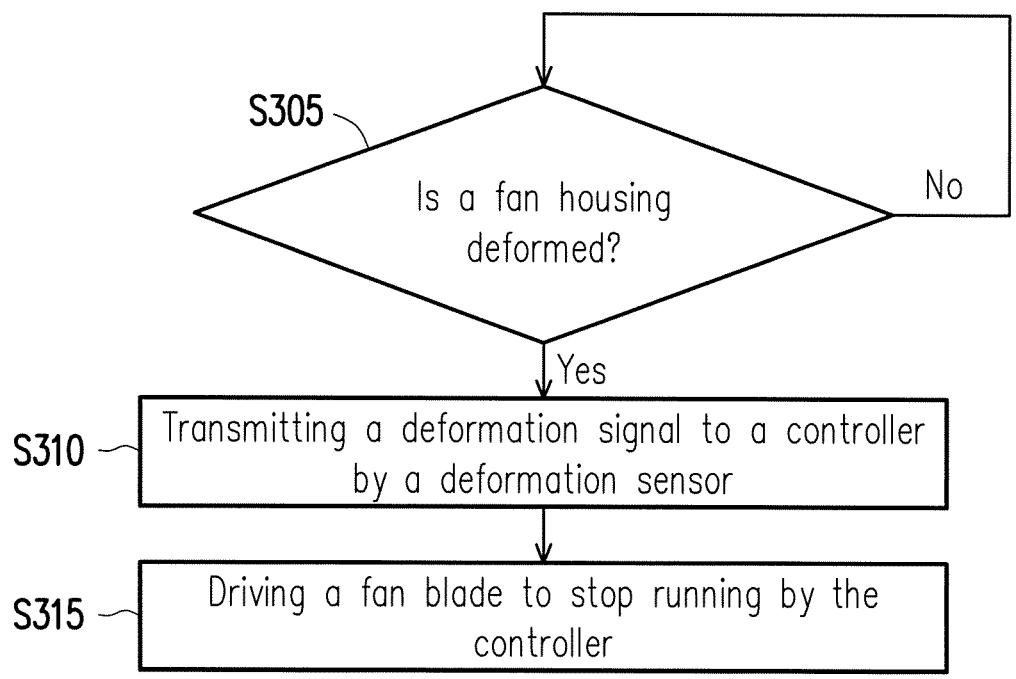
FIG. 3 is a flowchart of a method for controlling a fan operation according to an embodiment of the invention.

FIG. 3 is a flowchart of a method for controlling a fan operation according to an embodiment of the invention. With reference to FIG. 1 to FIG. 3, in step S305, whether the fan housing 140 is deformed is detected by the deformation sensor 110. When the deformation sensor 110 detects that the fan housing 140 is deformed, a deformation signal is transmitted to the controller 120 by the deformation sensor 110 in step S310. For example, when the upper housing 210 is pressed by the external force to a certain extent, the deformation sensor 110 is triggered to generate and transmit the deformation signal to the controller 120.

Then, as shown in step S315, the controller 120 drives the fan blade 150 to stop running after receiving the deformation signal. A method for driving the fan blade 150 to stop running may be, for example, utilizing an electromagnetic attraction force of an electromagnet to make a metal fan blade stops running, or directly giving a command to a drive-motor so the drive-motor stops running. Examples are provided below for detailed description.

Figure 4A:
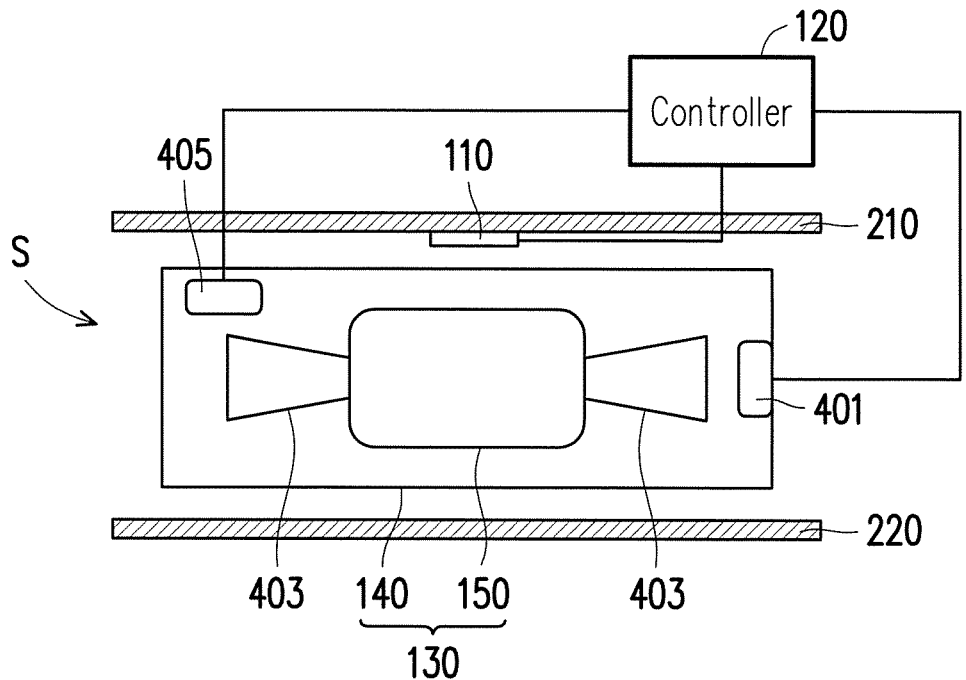
FIG. 4A is a schematic diagram of a fan module according to an embodiment of the invention.
Figure 4B:
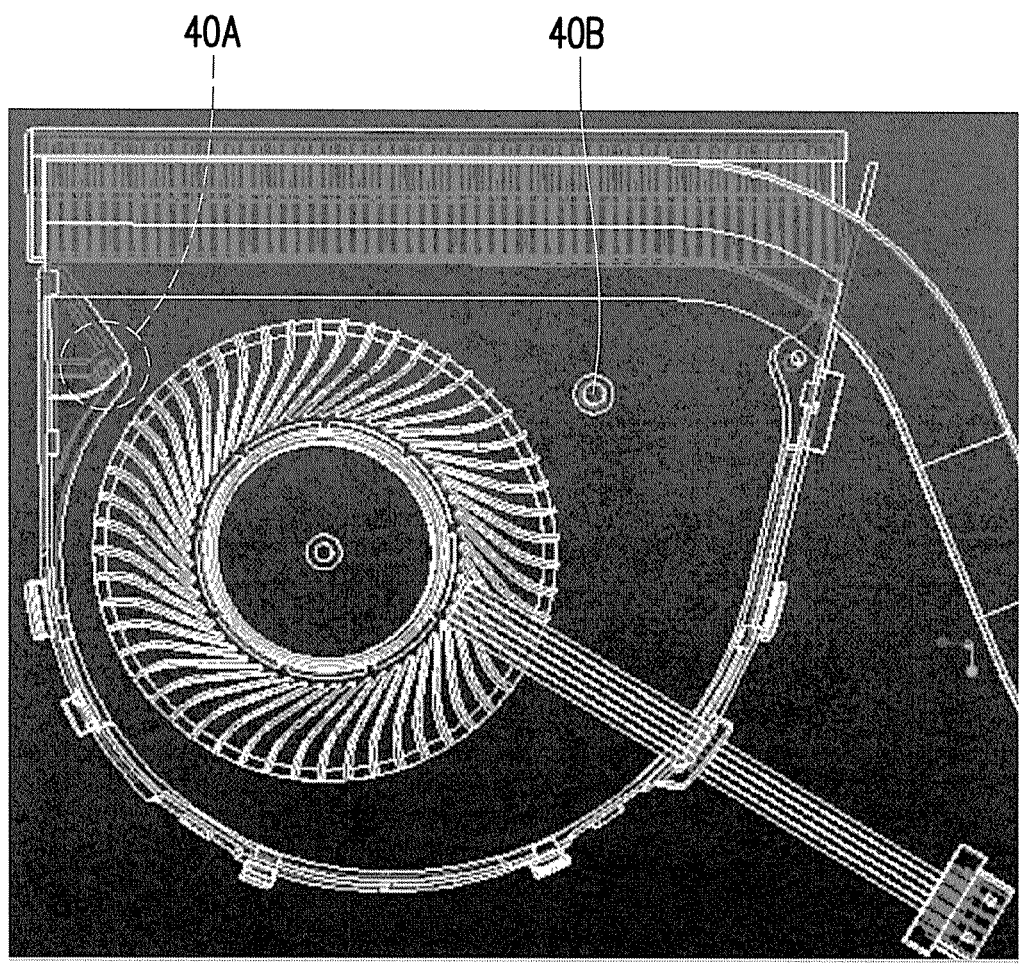
FIG. 4B is a schematic diagram of a fan configuration according to an embodiment of the invention.
Figure 5:
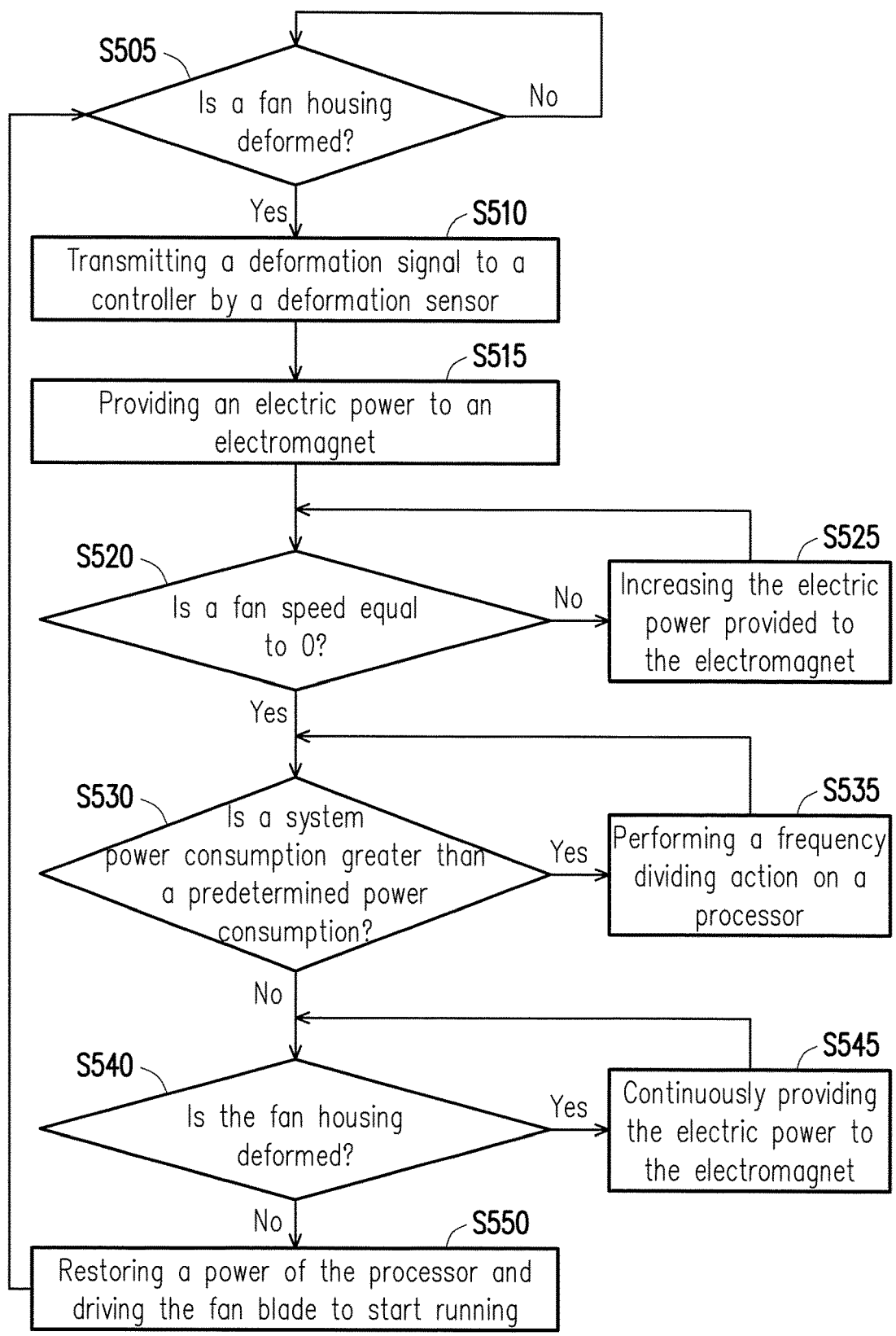
FIG. 5 is a flowchart of a method for controlling a fan operation according to another embodiment of the invention.

FIG. 4A is a schematic diagram of a fan module according to an embodiment of the invention. FIG. 4B is a schematic diagram of a fan configuration according to an embodiment of the invention. FIG. 5 is a flowchart of a method for controlling a fan operation according to another embodiment of the invention. The present embodiment is an application example of FIG. 3. With reference to FIG. 4A, in the present embodiment, the fan module 130 further includes an electromagnet 401, and the fan blade 150 includes a metal fan blade 403. The electromagnet 401 generates an electromagnetic attraction force after being powered up, and the metal fan blade 403 stops running due to the electromagnetic attraction force. With reference to FIG. 4B, the electromagnet 401 may be, for example, disposed at a tongue portion 40A or an air inlet 40B of the fan housing 140.

With reference to FIG. 5, in step S505, whether the fan housing 140 is deformed is detected by the deformation sensor 110. When the deformation sensor 110 detects that the fan housing 140 is deformed, a deformation signal is transmitted to the controller 120 by the deformation sensor 110 in step S510. Then, as shown in step S515, the controller 120 provides an electric power to the electromagnet 401 after receiving the deformation signal so the metal fan blade 403 stops running due to the electromagnetic attraction force.

Next, in step S520, whether a fan speed is equal to 0 is determined. If the fan speed is not equal to 0, it means that the fan blade is yet to stop running completely. In such case, as shown in step S525, the controller 120 increases the electric power provided to the electromagnet 401 to increase the electromagnetic attraction force until the fan speed is equal to 0.

For example, a fan speed sensor 405 is further disposed in the containing space S of the electronic device 100 so the fan speed sensor 405 can be utilized to detect the fan speed of the metal fan blade 403. Here, the fan speed sensor 405 is disposed inside the fan housing 140.

After determining that the fan speed is equal to 0, in step S530, the controller 120 determines whether a system power consumption is greater than a predetermined power consumption. For example, the predetermined power consumption is 70% thermal design power (TDP). The TDP represents an index of heat dissipation when a processor reaches maximum loading (the unit is watts (W)), and a maximum capability for dissipating heat that a cooling system of the electronic device 100 needs to provide. When the system power consumption of the processor is greater than the predetermined power consumption, as shown in step S535, the controller 120 performs a frequency dividing action on the processor until the system power consumption is less than or equal to the predetermined power consumption. Said frequency dividing action is configured to lower a speed of the processor in order to reduce the system power consumption. This action is performed to ensure that the system does not suffer overheat when the fan blade 150 stops running.

After determining that the system power consumption is less than or equal to the predetermined power consumption, in step S540, the controller 120 continuously detects whether the fan housing 140 is deformed by the deformation sensor 110.

When continuously detecting that the fan housing 140 is deformed, in step S545, the electric power is continuously provided to the electromagnet 401 so the fan blade 150 continuously stops running. On the other hand, when detecting that the fan housing 140 is released from being deformed, the controller 120 restores a power of the processor (e.g., which is restored to the system power consumption before the frequency dividing action is performed) and drives the fan blade 150 to start running. In the present embodiment, the controller 120 stops providing the electric power to the electromagnet 401 so the metal fan blade 403 can resume running after the electromagnetic attraction force is gone. Afterwards, the method returns back to step S505, in which whether the fan housing 140 is deformed is continuously detected by the deformation sensor 110.

Figure 6:
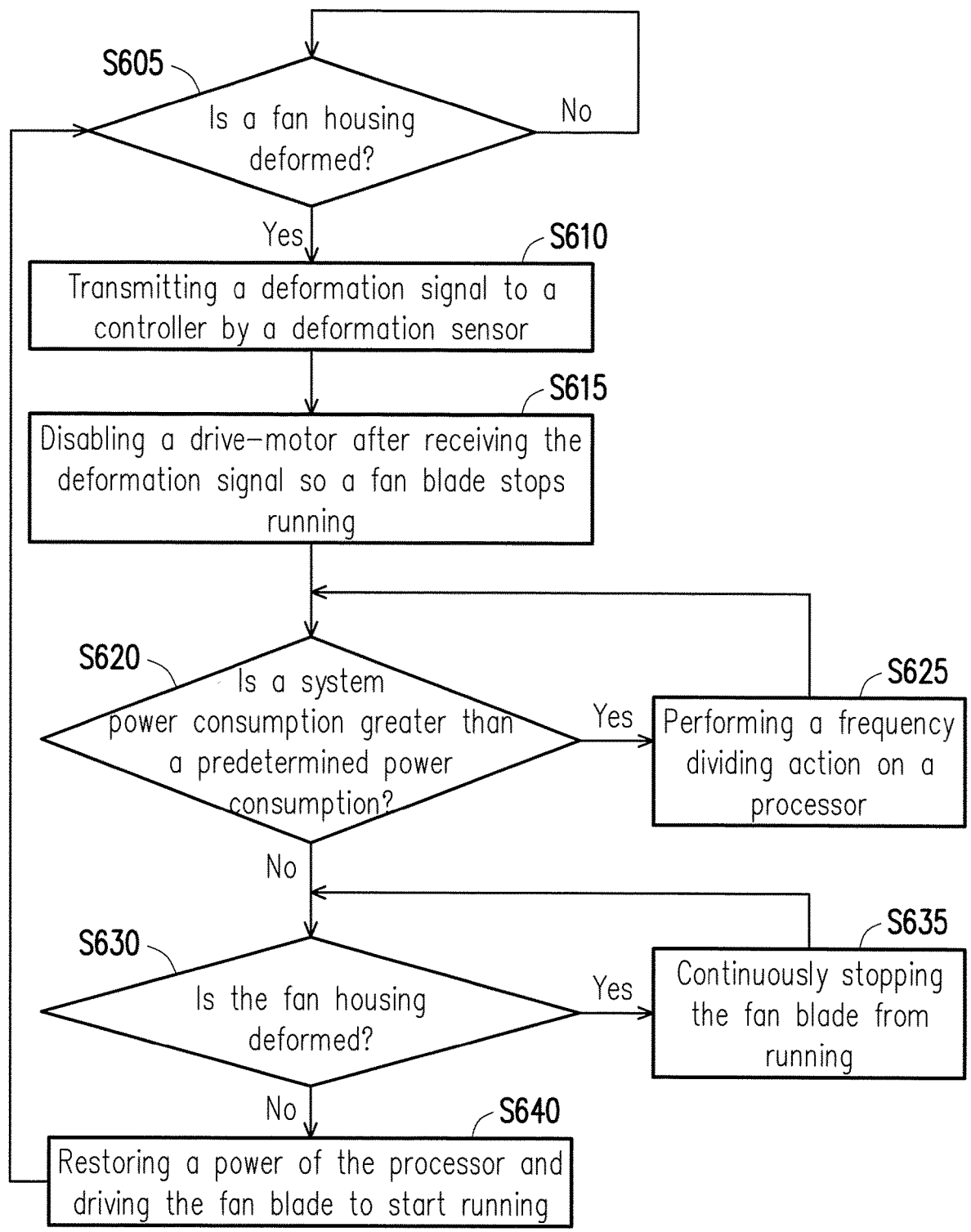
FIG. 6 is a flowchart of a method for controlling a fan operation according to an embodiment of the invention.

FIG. 6 is a flowchart of a method for controlling a fan operation according to an embodiment of the invention. The present embodiment is an application example of FIG. 3. In the present embodiment, the fan module 130 further includes a drive-motor (not shown), and the drive-motor is coupled to the fan blade 150 and configured to drive the fan blade 150 to start running. Also, the controller 120 can give a command to the drive-motor of the fan module 130 so as to disable or enable the drive-motor.

In step S605, whether the fan housing 140 is deformed is detected by the deformation sensor 110. When the deformation sensor 110 detects that the fan housing 140 is deformed, a deformation signal is transmitted to the controller 120 by the deformation sensor 110 in step S610. Then, as shown in step S615, the controller 120 disables the drive-motor after receiving the deformation signal so the fan blade 150 stops running. For example, if the controller 120 is the fan control chip, the controller 120 can directly give the command to disable to the drive-motor. In addition, if the controller 120 is the embedded controller or additionally disposed control chip, the controller 120 can transmit a fan stopping signal to the fan control chip so the fan control chip can disable the drive-motor after receiving the fan stopping signal.

After the fan blade 150 stops running, in step S620, the controller 120 determines whether a system power consumption is greater than a predetermined power consumption. For example, the predetermined power consumption is 70% TDP. When the system power consumption is greater than the predetermined power consumption, as shown in step S625, the controller 120 performs a frequency dividing action on the processor (not shown) until the system power consumption is less than or equal to the predetermined power consumption. This action is performed to ensure that the system does not suffer overheat when the fan blade 150 stops running.

After determining that the system power consumption is less than or equal to the predetermined power consumption, in step S630, the controller 120 continuously detects whether the fan housing 140 is deformed by the deformation sensor 110. When continuously detecting that the fan housing 140 is deformed, in step S635, the fan blade 150 is continuously stopped from running. On the other hand, when detecting that the fan housing 140 is released from being deformed, the controller 120 restores a power of the processor (e.g., which is restored to the system power consumption before the frequency dividing action is performed) and drives the fan blade 150 to start running. In the present embodiment, the controller 120 enables the drive-motor to drive the fan blade 150 to start running. Afterwards, the method returns to step S605, in which whether the fan housing 140 is deformed is continuously detected by the deformation sensor 110.

In a method for controlling the fan operation according to another embodiment, the deformation sensor 110 may be implemented by disposing the first metal sheet 22b on the surface of the fan housing 140 and disposing the second metal sheet 22a inside the housing of the electronic device 100 (e.g., on the inner side of the lower housing 220). When the lower housing 220 of the electronic device 100 is deformed by the external force, the deformed second metal sheet 22a' is in contact with the first metal sheet 22b to cause the short circuit so the controller 120 can drive the fan blade 150 to stop running after detecting the short-circuit condition.

In the present embodiment, the fan module 130 may further include the fan driving circuit 230, which is disposed inside the fan housing 140 and coupled to the fan blade 150 to drive the fan blade 150 to start running. After the controller 120 detects the short-circuit condition, the controller 120 generates and transmits the deformation signal to the fan driving circuit 230 so the fan blade 150 stops running. After the fan blade 150 stops running, as described above, the controller 120 can determine whether the system power consumption is greater than the predetermined power consumption and continuously detect whether the fan housing 140 is deformed, and details regarding the same are not repeated hereinafter.

In summary, the invention is capable of achieving the intelligent fan temporarily stopping function by a combination of the deformation sensor and the controller to drive the fan blade to stop running right after determining that the fan housing is deformed in the situation where the fan module is running at full speed. As a result, the fan module may be prevented from damages due to external influence so the operating life of the fan module can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An electronic device, comprising: a fan module, disposed in a containing space, and comprising a fan housing and a fan blade, wherein the fan blade is disposed inside the fan housing; a deformation sensor, disposed directly on the fan module, and directly detecting whether the fan housing is deformed; and a controller; electrically connected to the fan module and the deformation sensor; wherein the deformation sensor transmits a deformation signal to the controller when detecting that the fan housing is deformed, and the controller is configured to force the fan blade to stop running after receiving the deformation signal; wherein the fan blade is a metal fan blade, the fan module includes an electromagnet, and the controller is configured to force the fan blade to completely stop, wherein the controller provides an electric power to the electromagnet after receiving the deformation signal to make the electromagnet generate an electromagnetic attraction force after being powered up and keeps applying the electromagnetic attraction force until the metal fan blade is forced to completely stop due to the electromagnetic attraction force, a fan speed sensor coupled to the controller and detecting a fan speed of the metal fan blade, wherein the metal fan blade is forced to completely stop comprising: when the controller determines whether the fan speed is equal to 0, after providing the electric power to the electromagnet, if the controller determines the fan speed is not equal to 0, the controller increases the electric power provided to the electromagnet to increase the electromagnetic attraction force until the fan speed is equal to 0.

2. The electronic device of claim 1, wherein the fan module further comprises:
   a drive-motor, coupled to the fan blade, and driving the fan blade to start running,
   wherein the controller disables the drive-motor after receiving the deformation signal so the fan blade stops running.

3. The electronic device of claim 1, further comprising:
   a processor, coupled to the controller,
   wherein the controller determines whether a system power consumption of the processor is greater than a predetermined power consumption after the fan blade is forced to stop, and
   when the system power consumption is greater than the predetermined power consumption, the controller performs a frequency dividing action on the processor to lower a speed of the processor until the system power consumption is less than or equal to the predetermined power consumption.

4. The electronic device of claim 3, wherein whether the fan housing is deformed is continuously detected by the deformation sensor after the system power consumption is less than or equal to the predetermined power consumption, and the controller keeps forcing the fan blade to stop from running when continuously detecting that the fan housing is deformed, and the controller restores the system power consumption of the processor before the frequency dividing action is performed and drives the fan blade to start running when the deformation sensor detects that the fan housing is released from being deformed.

5. The electronic device of claim 1, wherein the deformation sensor is one of a strain gauge, a distance sensor, a click sensor and a Hall sensor.

6. A method for controlling a fan operation, comprising: detecting whether a fan housing of a fan module is deformed by a deformation sensor, wherein the fan is disposed in a containing space of an electronic device, and the deformation sensor is disposed directly on the fan module and directly detects whether the fan housing is deformed; transmitting a deformation signal to a controller by the deformation sensor when detecting that the fan housing is deformed; and forcing a fan blade of the fan module to stop running after receiving the deformation signal by the controller, wherein the fan blade is a metal fan blade, the fan module includes an electromagnet, the electromagnet generates an electromagnetic attraction force after being powered up and after receiving the deformation signal by the controller, the method further comprises: providing an electric power to the electromagnet to make the electromagnet generate the electromagnetic attraction force after being powered up and keeps applying the electromagnetic attraction force until the metal fan blade is forced to completely stop due to the electromagnetic attraction force, and forcing the metal fan blade to completely stop, wherein when the controller determines whether a fan speed of the metal fan blade is equal to 0, after providing the electric power to the electromagnet, if the controller determines the fan speed is not equal to 0, the controller increases the electric power provided to the electromagnet to increase the electromagnetic attraction force until the fan speed is equal to 0.

7. The method for controlling the fan operation of claim 6, wherein after receiving the deformation signal by the controller, the method further comprises:

disabling a drive-motor so the fan blade stops running, wherein the drive-motor is coupled to the fan blade to drive the fan blade to start running.

8. The method for controlling the fan operation of claim 6, wherein the electronic device further comprises a processor coupled to the controller, and wherein after the step of forcing the fan blade to stop running, the method further comprises:

determining whether a system power consumption of the processor is greater than a predetermined power consumption;

when the system power consumption is greater than the predetermined power consumption, performing a frequency dividing action on the processor to lower a speed of the processor until the system power consumption is less than or equal to the predetermined power consumption.

9. The method for controlling the fan operation of claim 8, wherein the electronic device includes a drive-motor coupled to the fan blade to drive the fan blade to start running, wherein after, the step of determining whether the system power consumption of the electronic device is greater than the predetermined power consumption, the method further comprises:

continuously detecting whether the fan housing is deformed by the deformation sensor after the system power consumption is less than or equal to the predetermined power consumption, and continuously forcing the fan blade to stop from running when continuously detecting that the fan housing is deformed; and restoring the system power consumption of the processor before the frequency dividing action is performed and driving the fan blade to start running when detecting that the fan housing is released from being deformed.

10. The method for controlling the fan operation of claim 6, wherein the deformation sensor is one of a strain gauge, a distance sensor, a click sensor and a Hall sensor.

* * * * *